United States Patent
Harada

(10) Patent No.: US 6,358,814 B1
(45) Date of Patent: Mar. 19, 2002

(54) METHOD FOR MANUFACTURING SEMICONDUCTOR DEVICES HAVING AN EPITAXIAL LAYER AND WAFER ALIGNMENT MARKS

(75) Inventor: Kouichi Harada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/306,727

(22) Filed: May 7, 1999

(30) Foreign Application Priority Data

May 11, 1998 (JP) .......................................... 10-126945

(51) Int. Cl.[7] .............................................. H01L 21/76

(52) U.S. Cl. ...................... 438/401; 438/402; 438/403

(58) Field of Search .......................... 438/462, 401–403, 438/504, 975

(56) References Cited

U.S. PATENT DOCUMENTS 4,632,724 A    12/1986  Chesebro et al.
4,936,930 A  *  6/1990  Gruber et al. ................ 148/33

FOREIGN PATENT DOCUMENTS

EP    0564191 A2   10/1993
GB    2305778 A     4/1997

* cited by examiner

*Primary Examiner*—David Nelms
*Assistant Examiner*—Dung Ang Le
(74) *Attorney, Agent, or Firm*—Sonnenschein, Nath & Rosenthal

(57) ABSTRACT

To control the positional relation between semiconductor regions formed on an epitaxial layer after the epitaxial layer is formed with high accuracy in a method for manufacturing semiconductor devices in which a plurality of semiconductor regions are formed selectively on the epitaxial layer on the semiconductor surface having a semiconductor region formed selectively on the semiconductor surface, a first wafer alignment mark is formed on the semiconductor substrate surface to be served as the under layer of an epitaxial layer which will be formed subsequently, and the wafer alignment mark is used as an index for wafer alignment for forming selectively a semiconductor region, and a second wafer alignment mark is formed on the surface of the epitaxial layer after the epitaxial layer is formed, and the second wafer alignment mark is used as an index for wafer alignment for forming respective semiconductor regions on the epitaxial layer.

2 Claims, 2 Drawing Sheets

METHOD FOR MANUFACTURING SEMICONDUCTOR DEVICES HAVING AN EPITAXIAL LAYER AND WAFER ALIGNMENT MARKS

RELATED APPLICATION DATA

The present application claims priority to Japanese Application No. P10-126945 filed May 11, 1998, which applications are incorporated herein by reference to the extent permitted by law.

BACKGROUND OF THE INVENTION

1. Field of the Invention

This invention relates to a method for manufacturing semiconductor devices and more particularly to a method for manufacturing semiconductor devices in which a semiconductor region is formed selectively on the surface of a semiconductor, an epitaxial layer is thereafter formed on the semiconductor, and various semiconductor regions are subsequently formed on the epitaxial layer.

2. Description of Related Art

Semiconductor devices which are manufactured by a method in which a semiconductor region of the conduction type opposite to that of a substrate formed on the semiconductor substrate surface or on the epitaxial layer surface of the substrate surface is formed, an epitaxial layer is thereafter formed on the semiconductor substrate or the epitaxial layer, and various semiconductor regions are formed successively on the epitaxial layer have been known. For example, a solid state image sensing device disclosed in Japanese Published Unexamined Patent Application No. Hei 9-331058 belongs to such a semiconductor device. FIG. 2 shows a cross sectional view of such a semiconductor device. In FIG. 2, reference numeral 1 denotes a solid state image sensing device, reference numeral 2 denotes an n-type semiconductor substrate, reference numeral 3 denotes an epitaxial layer of the same conduction type as the n-type semiconductor substrate 2 with a low impurity concentration, and reference numeral 4 denotes a p-type well formed selectively on the surface of the epitaxial layer 3. In FIG. 2, it is not obvious whether the well is formed selectively. However, the well is formed selectively. Reference numeral 5 denotes a p-type (or n-type, or intrinsic) semiconductor region containing a concentration impurity considerably lower than that of the well 4, which are formed by epitaxial growth. In the semiconductor region 5, various semiconductor regions 6 to 9, and 14 are formed, further a transfer electrode 16, an interlayer insulating film 18, and a shielding film 17 are formed on the semiconductor surface with interposition of a gate insulating film 15. The applicant of this invention proposed another solid state image sensing device which was technically related to this solid state image sensing device in Japanese Patent Application No. Hei 8-270456. The solid state image sensing device has a similar cross sectional structure as that shown in FIG. 2.

The most important component of the device is the epitaxial layer. The p-type well layer 4 is formed selectively on the surface of the epitaxial layer 3 which is the under layer of the semiconductor region 5, various semiconductor regions 6 to 9, and 14 are formed on the semiconductor region 5, and the positional relation between the p-type well layer 4 and the semiconductor regions 6 to 9 and 14 is required to be highly accurate and the positional relation between the semiconductor regions 6 to 9 and 14 is required to be controlled with a considerably high accuracy. In a conventional method for controlling the positional relation, the wafer alignment mark is formed on a semiconductor substrate and a semiconductor region is formed with reference to the wafer alignment mark, and wafer alignment is performed every time when various semiconductor regions 4, 6 to 9, and 14 are formed respectively (mask matching) by use of the alignment mark as an index.

FIG. 3A to FIG. 3D is sectional views for describing the outline of such a conventional method. First, as shown in FIG. 3A, a wafer alignment mark b is formed on the surface of a semiconductor substrate a, and then a semiconductor region c is formed selectively on the surface of the semiconductor substrate a by photolithography using the wafer alignment mark b as an index for mask matching as shown in FIG. 3B. Next, as shown in FIG. 3C, an epitaxial layer d is formed on the semiconductor substrate a. At that time, a wafer alignment mark b' on which the above-mentioned wafer alignment mark b is reflected is formed concomitantly on the surface of the epitaxial layer d. Subsequently, as shown in FIG. 3D, a semiconductor region e is formed selectively on the epitaxial layer d by photolithography using the wafer alignment mark b' as an index for mask matching. Of course, the number of semiconductor region e formed on the epitaxial layer d is not one, generally a plurality of semiconductor regions are formed, and a wafer alignment mark b' is used as an index in wafer alignment every time respectively when the plurality of semiconductor regions are formed.

However, the conventional method for manufacturing semiconductor devices shown in FIG. 3 is disadvantageous in that the position of the wafer alignment mark b' does not coincide with the position of the wafer alignment mark b, and the configuration of the wafer alignment mark b' becomes different from that of the wafer alignment mark b, particularly the edge is rounded to cause optical misdetection. In detail, as described in a literature, for example, Electronics Material Series: Silicon Crystal and Doping, P86 to 89, when an epitaxial layer is formed on a substrate having a pit on the surface, a pit is formed concomitantly on the epitaxial layer which reflects the pit on the substrate, in such case, the pit on the epitaxial layer is different from the pit on the substrate in the position, configuration, and sharpness of the edge (edgy corner) (rounded). Such positional deviation and magnitude of rounding (decreased sharpness of the edge) depend on the growth temperature, growth pressure, type of silicon source, and growing rate.

Accordingly, in the conventional method, the wafer alignment mark b' is rounded to cause reduced optical detectability. Therefore, it is difficult to enhance the control accuracy of the positional relation between a plurality of semiconductor regions formed on an epitaxial layer d because such wafer alignment mark b' is used as an index in wafer alignment. This poor control accuracy has become a serious problem, because higher positional accuracy for positioning a plurality of semiconductor regions formed selectively on an epitaxial layer has been required with increasing integration of semiconductor devices such as solid state image sensing device and with increasing minimization of devices.

SUMMARY OF THE INVENTION

The present invention is accomplished to solve the problem, it is an object of the present invention to provide a way to control the positional relation between a plurality of semiconductor regions formed selectively on an epitaxial layer after forming of the epitaxial layer in a method for manufacturing semiconductor devices in which the epitaxial layer is formed on a semiconductor surface having a semiconductor region formed selectively, and then a plurality of semiconductor regions are formed successively on the epitaxial layer selectively.

In a method for manufacturing semiconductor devices described in claim 1, a first wafer alignment mark is formed on the semiconductor substrate surface to be served as the under layer of an epitaxial layer which will be formed subsequently, and the first wafer alignment mark is used as an index for wafer alignment for forming selectively a semiconductor region on the semiconductor, and a second wafer alignment mark is formed on the surface of the epitaxial layer after the epitaxial layer is formed, and the second wafer alignment mark is used as an index for wafer alignment for forming respective semiconductor regions on the epitaxial layer.

According to the method for manufacturing semiconductor devices described in claim 1, the second wafer alignment mark is formed on the surface of the epitaxial layer after the epitaxial layer is formed and the additional wafer alignment mark having the sharp edge is used for wafer alignment of the respective semiconductor regions which are formed on the epitaxial layer as an index. Thus, the positional relation between the respective semiconductor regions which are formed on the epitaxial layer is controlled with high accuracy.

The positional relation of the semiconductor region which is formed on the semiconductor surface to be served as an under layer of the epitaxial layer to the respective semiconductor regions which are formed on the epitaxial layer is controlled with some accuracy by a method in which the third wafer alignment mark formed on the semiconductor surface after the epitaxial layer is formed is positioned with reference to the third wafer alignment mark formed concomitantly when the epitaxial layer is formed on the surface of the epitaxial layer with reflection of the first wafer alignment mark which has been formed on the semiconductor surface before the epitaxial layer is formed as an index.

The second wafer alignment mark is formed on a different position from the first and third wafer alignment marks in the direction along the surface of the semiconductor and epitaxial layer.

According to a semiconductor device having a semiconductor region formed selectively on an epitaxial layer on a semiconductor surface on which a semiconductor regions is formed selectively described in claim 4, the semiconductor device has a first wafer alignment mark on the semiconductor surface and a second wafer alignment mark on the surface of the epitaxial layer on the different position from the first wafer alignment mark in the direction along the surface of the semiconductor and epitaxial layer.

DETAILED DESCRIPTION OF THE PREFERRED EMBODIMENT

The method for manufacturing semiconductors of the present invention is basically a method in which a wafer alignment mark for serving as a wafer alignment index in selective formation of semiconductor regions on the semiconductor is formed on the semiconductor surface, which is to be served as the under layer, before an epitaxial layer is formed, and an additional wafer alignment mark for serving as a wafer alignment index in forming semiconductor regions on the epitaxial layer is formed on the surface of the epitaxial layer after the epitaxial layer is formed. In this embodiment the present invention is applied to a semiconductor device, for example, a solid state image sensing device, however, the semiconductor device is by no means limited to a solid state image sensing device, and the present invention may be applied to other types of semiconductor devices.

Figure 2:
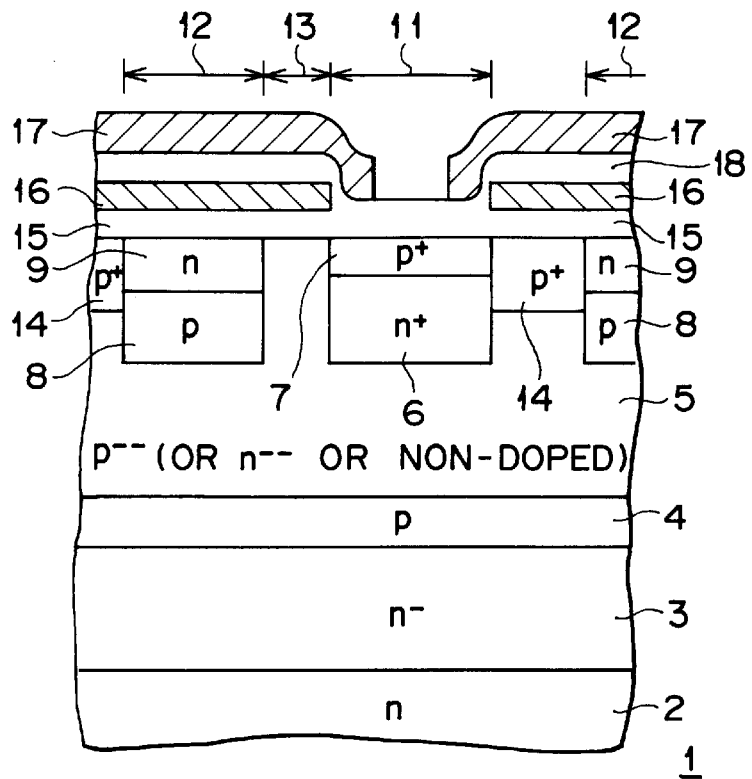
FIG. 2 is a cross sectional view for describing one example of a semiconductor device (solid state imaging device) to which the present invention can be applied.
Figure 3A:
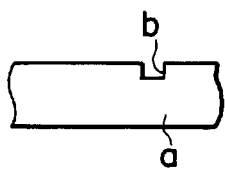
FIG. 3A to FIG. 3D are cross sectional views for describing one conventional example of a method for manufacturing semiconductor devices in the process order.
Figure 3B:
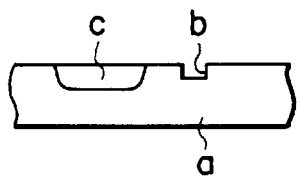
Figure 3C:
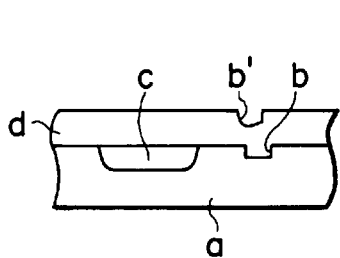
Figure 3D:
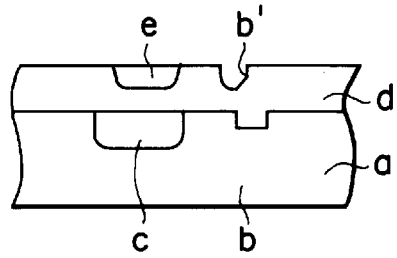

A semiconductor substrate is used as the semiconductor which is served as the under layer of the epitaxial layer, otherwise a laminate comprising a semiconductor substrate and an epitaxial layer formed on the semiconductor substrate may be used as the semiconductor which is served as the under layer of the epitaxial layer (the example shown in FIG. 2), in this case, a substrate epitaxial layer is formed and then a semiconductor region is formed selectively on the epitaxial layer surface, and further another epitaxial layer is formed on the existing epitaxial layer. An additional wafer alignment mark is formed on the epitaxial layer surface, all semiconductor regions are formed selectively on the epitaxial layer using the additional wafer alignment mark formed for wafer alignment.

The additional wafer alignment mark formed on the semiconductor surface after the epitaxial layer is formed is positioned preferably with reference to the wafer alignment mark formed on the semiconductor substrate surface before the epitaxial layer is formed. The reason is that the semiconductor region formed on the semiconductor which is served as the under layer of the epitaxial layer can be positioned in proper positional relation with a certain accuracy to the semiconductor regions formed on the epitaxial layer formed on the semiconductor.

EMBODIMENT

The present invention will be described in detail hereinafter with reference to the example shown in the drawings. FIG. 1A to FIG. 1E are cross sectional views for describing the manufacturing process of a semiconductor device of the present invention.

Figure 1A:
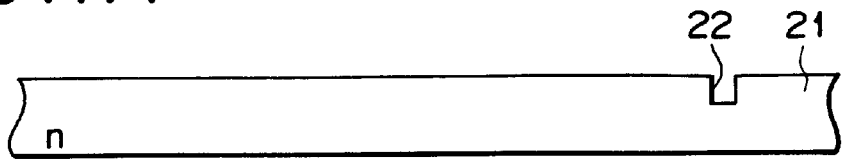
FIG. 1A to FIG. 1E are cross sectional views for describing one example of a method for manufacturing semiconductor devices of the present invention in the process order.

(A) As shown in FIG. 1A, for example, a first wafer alignment mark 22 is formed on the surface of a silicon semiconductor substrate 21.

Figure 1B:
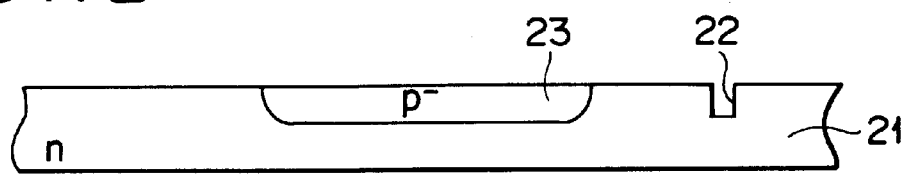

(B) Next, as shown in FIG. 1B, a semiconductor region 23 is formed selectively on the surface of the semiconductor substrate 21. The above-mentioned first wafer alignment mark 22 is served as an index for wafer alignment required when the semiconductor region 23 is formed selectively.

Figure 1C:
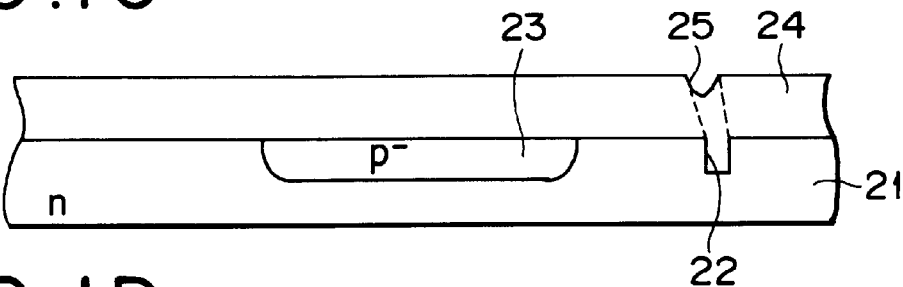

(C) Next, as shown in FIG. 1C, an epitaxial layer 23 is formed on the semiconductor substrate 21. A second wafer alignment mark 25 is formed concomitantly, which reflects the first wafer alignment mark 22 on the surface of the semiconductor substrate 21, on the surface of the epitaxial layer 24. Though the second wafer alignment mark 25 is formed with reflection of the first wafer alignment mark 22 on the surface of the semiconductor substrate 21, position deviation and rounding of edge could be caused as described hereinbefore.

Figure 1D:
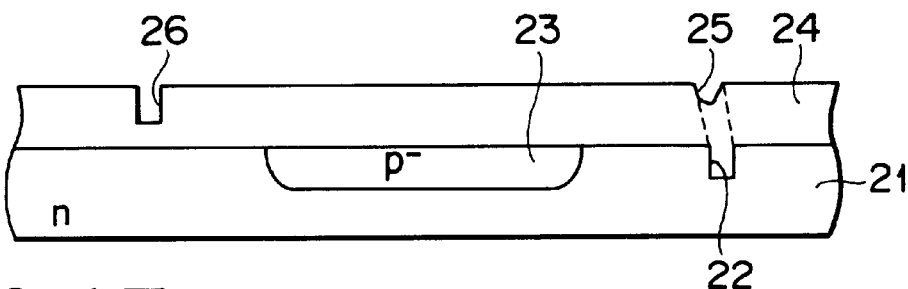

(D) Next, as shown in FIG. 1D, a third wafer alignment mark 26 is formed selectively on the epitaxial layer 24. The above-mentioned second wafer alignment mark 25 is served for wafer alignment required to form this third wafer alignment mark 26. Though there is a limit in ability for controlling accurately the positional relation of the selectively formed third wafer alignment mark 26 to the semiconductor region 23 because of the positional deviation and rounded edge of the second wafer alignment mark 25, this method secures some accuracy and in this case the high control accuracy is not required for the positional relation of the semiconductor region 23 to various semiconductor regions (27, 28 and 29) which will be formed later on the epitaxial layer 24, therefore the accuracy does not cause the problem.

Figure 1E:
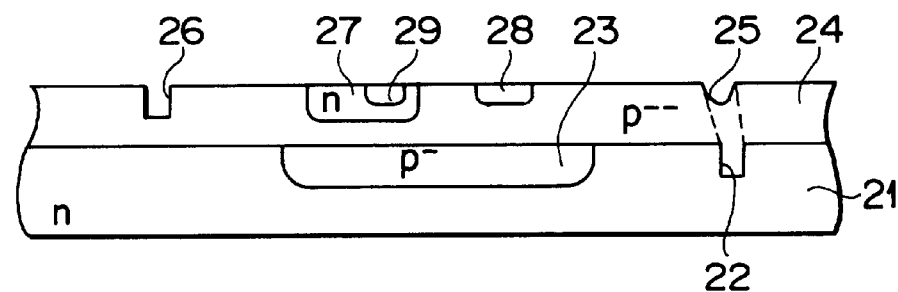

(E) As shown in FIG. 1E, various semiconductor regions 27 to 29 are formed successively on the above-mentioned epitaxial layer 24. At that time, various semiconductor regions 27 to 29 are formed selectively on the epitaxial layer 24 with wafer alignment by use of the third wafer alignment mark 26 as an index. Though various insulating films and wiring films are formed on the epitaxial layer 24 afterward, description of these films is omitted because these films do not relate essentially to the present invention.

According to the method for manufacturing semiconductor devices, because various semiconductor regions 27 to 29 are formed on the epitaxial layer 24 with wafer alignment by use of the third wafer alignment mark 26 formed on the epitaxial layer 24 having the sharp edge, not rounded edge, as an index, the positional relation between the semiconductor regions 27 to 29 is controlled with higher accuracy at least in comparison with the conventional method in which the second wafer alignment mark 25 with low delectability is used as an index.

The control accuracy of the positional relation of the semiconductor region 23 formed on the surface of the semiconductor substrate 21 to the semiconductor regions 27 to 29 formed on the epitaxial layer 24 is lower than the control accuracy of the positional relation between the respective semiconductor regions 27 to 29 formed on the epitaxial layer 24 because the wafer alignment in which the wafer alignment mark having the rounded edge specifies the positional relation with positional deviation is used as an index as described herein above, however, generally the positional relation of the semiconductor region 23 to the semiconductor regions 27 to 29 requires lower control accuracy than the control accuracy of the positional relation between the semiconductor regions 27 to 29, this method of wafer alignment does not cause the problem.

In the above-mentioned embodiment, the present invention is applied to a type of the semiconductor device formed by a process in which the semiconductor region 23 is formed on the surface of the semiconductor substrate 21, the epitaxial layer 24 is formed on the surface of the semiconductor substrate 21, and a plurality of semiconductor regions 27 to 29 are formed on the epitaxial layer 24, however, the present invention is by no means limited to this type, and may be applied to a type of a semiconductor device formed by a process in which the first epitaxial layer is formed on a semiconductor substrate, a semiconductor regions is formed selectively on the surface of the epitaxial layer, the second epitaxial layer is formed on the first epitaxial layer, and a plurality of semiconductor regions are formed on the surface of the second epitaxial layer.

According to the method for manufacturing semiconductor devices as described in claim 1, after an epitaxial layer is formed a wafer alignment mark is formed on the epitaxial layer, and the wafer alignment mark having the sharp edge is used for wafer alignment of respective semiconductor regions formed on the epitaxial layer as an index. Thus, the positional relation between respective semiconductor regions formed on the epitaxial layer is controlled with high accuracy.

According to the method for manufacturing semiconductor devices as described in claim 2, because a wafer alignment mark to be formed on the semiconductor surface after the epitaxial layer is formed is positioned by use of the wafer alignment mark formed concomitantly on the epitaxial layer surface when the epitaxial layer is formed, the positional relation of the semiconductor region formed on the semiconductor surface, which is served as an under layer of the epitaxial layer, to the semiconductor regions formed on the epitaxial layer can be controlled to some extent of accuracy.

What is claimed is:

1. A method for manufacturing semiconductor devices in which an epitaxial layer is formed on the semiconductor surface having a semiconductor region formed selectively on said semiconductor surface, and a plurality of semiconductor regions are formed selectively on said epitaxial layer, wherein:

a first wafer alignment mark is formed on the semiconductor surface to be served as the under layer of an epitaxial layer which will be formed subsequently, and said first wafer alignment mark is used as an index for wafer alignment for forming selectively a semiconductor region on said semiconductor; and a second wafer alignment mark is formed on the surface of said epitaxial layer after said epitaxial layer is formed, and said second wafer alignment mark is used as an index for wafer alignment for forming said plurality of semiconductor regions on said epitaxial layer, said second wafer alignment mark is positioned with reference to a third wafer alignment mark formed concomitantly when said epitaxial layer is formed with reflection of said first wafer alignment mark which has been formed on the semiconductor surface before said epitaxial layer is formed as an index.

2. A method for manufacturing semiconductors as claimed in claim 1, wherein said second wafer alignment mark is formed on a different position from said first and third wafer alignment marks in the direction along the surface of said semiconductor and epitaxial layer.

* * * * *